United States Patent
Mead et al.

(10) Patent No.: US 7,009,112 B1
(45) Date of Patent: Mar. 7, 2006

(54) CABLE ORGANIZATION APPARATUSES AND SYSTEMS

(75) Inventors: Jason D. Mead, Apple Valley, MN (US); Leslie L. Trifilio, St. Paul, MN (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 10/953,006

(22) Filed: Sep. 28, 2004

(51) Int. Cl.
*B65H 75/34* (2006.01)

(52) U.S. Cl. .................. 174/69; 211/26; 248/284.1; 312/223; 361/826; 385/134

(58) Field of Classification Search .............. 174/69; 211/26; 248/282.1, 284.1; 312/223; 361/825, 361/826; 385/100, 134, 135, 137
See application file for complete search history.

(56) References Cited

U.S. PATENT DOCUMENTS

| | | | | |
|---|---|---|---|---|
| 5,746,389 A | * | 5/1998 | Willmann | 174/69 |
| 6,070,742 A | | 6/2000 | McAnally et al. | 211/26 |
| 6,142,590 A | | 11/2000 | Harwell | 312/223.1 |
| 6,305,556 B1 | | 10/2001 | Mayer | 211/26 |
| 6,392,149 B1 | | 5/2002 | Kim et al. | 174/72 |
| 6,772,887 B1 | * | 8/2004 | Audibert et al. | 211/26 |
| 6,805,248 B1 | * | 10/2004 | Champion et al. | 211/26 |
| 2004/0035995 A1 | | 2/2004 | Chen et al. | 248/282.1 |

* cited by examiner

*Primary Examiner*—Dean A. Reichard
*Assistant Examiner*—Adolfo Nino
(74) *Attorney, Agent, or Firm*—Brooks & Cameron PLLC (57) ABSTRACT

Systems and apparatuses are provided for cable management. One apparatus embodiment includes an arm having an open and a closed position and two arm portions. Each arm portion has two ends and a bend formed at one end. The ends of each arm portion having the bend are hinged together.

29 Claims, 7 Drawing Sheets

CABLE ORGANIZATION APPARATUSES AND SYSTEMS

FIELD OF THE INVENTION

The present invention generally relates to electronic device rack structures and, in particular, relates to apparatuses and systems for organizing cables in a rack structure.

BACKGROUND

Electronic devices, such as computing devices for example, are often housed in vertical racks. For example, components often included in computing devices and systems using a rack include computers, such as servers (e.g., a network server, a data server, etc.) and direct access storage devices, such as disk drives, tape drives, and the like.

Racks enable electrical components to be installed vertically, taking up less floor space in a computer operations area. Multiple rack structures can, for example, be installed in a computer area allowing for growth and flexibility of the components installed. Racks typically have a number of components arranged vertically. The individual components are mounted in the rack by side mounted slides that attach to an exterior rack structure. The individual components can then be slid into and out of the rack. In this manner, the individual components can be accessed for repairing the component, providing upgrades, configuring the component, and connecting the component to other devices and/or components, among other tasks.

In many instances, the back of a component will have to be accessed in order to accomplish such tasks. In such instances, a component is able to be slid out of the rack structure such that the cable connections on the back of the component can be accessed.

Electronic devices within racks typically include a large number of cables that are connected to the various components of the electrical device. For instance each electrical component in a rack can have a number of cables associated with it. For example, a typical computer system component is connected to a video display device for an operator to view the operation of the computer system, a printer for printing, a network adapter for communicating with other computer systems on a local area network (LAN), a modem for connecting to other computers over the telephone system, and external storage devices such as disk drives, optical disks, and tape drives. Each of these connections usually involves attaching a cable to the component. These connections are typically made at the back of the unit by connecting the cable to connectors provided on the electrical component.

In addition, numerous electrical components can be housed in each rack. Consequently, managing the cables in the rack can become challenging. For instance, if not managed properly, the cables can become tangled which can result in cables becoming disconnected and/or damaged. It can also be difficult to determine what each cable is connected to when cables become crossed or tangled. Additionally, the tangling of the cables can restrict the slidable movement of the various components thereby making access to the components difficult.

Apparatuses and systems have been designed that use a folding cable arm to support and organize cables within rack structures. In such apparatuses and systems, the cables are aligned and/or attached to the arm as it actuates from a closed to an open position. The cable arm is typically positioned behind the electrical components in the rack. In such arrangements, the space available for the cable arm and cables attached thereto can be restricted by the size of the component, the size of the arm, the number of cables to be attached to the arm, and the proximity of the back of the rack structure to a wall or the back of a cabinet in which the rack is a part of or installed in.

Additionally, most cables have a minimum bend radius at which the cables can be bent without damage, such as breakage of the conductive flow through the cable, breakage of the non-conductive portions of the cable, and/or plastic deformation of the cable, such that the cable remains permanently bent. When cables are positioned in a rack structure with a foldable arm, the cable can be bent around the arm in such a manner as to exceed the minimum bend radius, thereby potentially damaging the cables aligned and/or attached thereto.

Further, in some situations, racks can be installed in environments where they encounter abrupt movements or vibrational movements. For example, when installed in a vehicle such as an air craft, water craft, space craft, or land craft, these abrupt or vibrational movements can result in an arm being bent, getting tangled in the cables, the cables becoming tangled together, the sharp edges of the arm cutting or otherwise damaging the cables, the arm becoming loosened or detached from the rack, among other such issues.

SUMMARY OF THE INVENTION

Embodiments of the present invention provide a number of cable organization apparatuses and systems. Embodiments of the present invention provide cable arms that reduce the amount of space used by the cable arm. Embodiments of the present invention can also maintain a desired bend radius for the cabling aligned with and/or attached to the arm. In this way, damage due to over-bending of the cables can be reduced. Embodiments of the present invention also provide support for cable arms that can reduce the effects of abrupt and/or vibrational forces.

The embodiments of the present invention can be used with racks having single cable arms and those having multiple cable arms. Embodiments of the present invention can also be used in various fields in which rack structures having cable arms are used. For example, electronic components such as computer components and audio components are two types of electrical components that use rack structures within their fields.

In one aspect, embodiments of the present invention are directed to a cable management apparatus. In one embodiment, the apparatus includes an arm having an open and a closed position and two arm portions. The embodiment also includes that each arm portion has two ends and a bend formed at one end. The ends of each arm portion that have the bend are hinged together.

In various embodiments, the apparatus can include that the ends of each arm portion having the bend are hinged to form a knuckle when the arm is in the closed position. The knuckle can be of any size. For example, the knuckle can be sized to maintain a particular bend radius. Such bend radii can include a radius sized to maintain a bend radius of a cable above that of a damaging bend radius. A damaging bend radius can be determined based upon the characteristics of the cables to be used with the apparatus, for example. In some embodiments, the use of a knuckle can allow for the use of thinner arm portions or arm portions that are positioned closer together, while allowing a desired bend radius at the end of the arm to be maintained. For example, an apparatus embodiment can have an arm width of ½ inch, while the knuckle has a diameter of 1 inch. In this way, the arm takes up half the space of the knuckle along its length, while the 1 inch knuckle can provide the apparatus with a particular bend radius that, in some instances, may be above that of a damaging bend radius.

Embodiments of the present invention include cable arms of any suitable configuration. For example, one such suitable configuration includes a cable arm that has hinged arm portions that are foldable to half their combined length; however, the embodiments of the present invention are not so limited.

Various embodiments include a cable arm having a number of arm portions and each arm portion having a back surface. In some embodiments, when the arm is in the closed position, the back surfaces can be substantially parallel with each other. In this way, the amount of space used by the arms can be reduced. For example, in arms that could not be bent such that they were parallel to each other, the arms, based upon the angled orientation, would take up a substantial amount of space (e.g., an inch between the back surfaces of the arms at one end).

Embodiments of the present invention can be used to reduce the amount of space that is used by the arms. For instance, when a knuckle on the arm is used, space can be reduced over much of the arm's surface, while a desired bend radius that is larger than the bend radius of typical straight arm portions can be maintained. As stated above, in some embodiments, the parallel arrangement of the backs of the arms is another way in which embodiments of the present invention can be designed to save space.

In another aspect of the present invention, embodiments include an electronics system including an electronic component, a rack, and a cable management apparatus. The rack is designed such that the electronic component can be slidably mounted therein. In various embodiments, the cable management apparatus can include a number of arms each arm having an open and a closed position and two arm portions. In such embodiments, each arm portion can include two ends and a bend formed at one end. The ends of each arm portion having the bend can be hinged together to form a knuckle.

In various embodiments, the system can include multiple arms. For example, three arms can be used. In such embodiments, the multiple arms can be used with a single component or with multiple components. Additionally, the multiple arms can be arranged in parallel to each other. In this way, contact between the arms themselves, the arms and cables, and the cables themselves can be reduced.

Additionally, in various multiple arm embodiments, the multiple arms can be positioned on opposite sides of the rack. For example, in one embodiment a rack system includes three arms with two arms arranged parallel to each other on one side of the rack and the third arm arranged on the other side of the rack.

Additionally, in various embodiments of the present invention, the edges of the arms can be blunted to reduce the possibility of damage to the cables if a cable should come in contact with an edge of an arm. For example, one or more of the edges of an arm can be rounded or chamfered in order to reduce the possibility of damage.

In another aspect of the present invention, various embodiments include an electronics system having an electronic component, a rack, and a cable management apparatus. In these embodiments the rack is designed to have an electrical component slidably mounted therein. The cable management apparatus includes a number of arms each having an open and a closed position and two arm portions. Each arm portion includes two ends, a cable side, and a back side, with one end of each arm portion hinged together. The embodiments also include back sides that are substantially parallel to each other when the arm is in the closed position.

Various embodiments can also include a number of vertical movement supports. The vertical movement supports can be positioned to restrict vertical movement of one of the arms when the arm is in the closed position. For example, the vertical supports can each include vertical support members positioned above and below each arm when each arm is in the closed position.

Embodiments can also include a number of horizontal movement supports positioned to restrict horizontal movement of one of the arms when the arm is in the closed position. Additionally, embodiments can include a number of horizontal and vertical movement supports that frictionally engage an arm of the apparatus or system. In this way, the frictionally engaging contact between the arm and the one or more supports can aid in resisting movement of the arm due to abrupt and vibrational movements of the environment.

In another aspect of the present invention, embodiment can include a rack apparatus having a number of slidable component mounts, a number of arms, and a movement support member. The number of slidable component mounts each having a fixed portion and a slidable portion. In various embodiments, the number of arms each has an open and a closed position and two arm portions and each arm portion having two ends and a bend formed at one end. In such embodiments, the ends of each arm portion having the bend can be hinged together and one of the other ends can be attached to the fixed portion of one of the mounts. The movement support member can be used to control the movement of the arm when the arm is in a closed position. Examples of movement support members include the horizontal and vertical supports discussed above.

In various embodiments, one or more of the arms can include a number of apertures formed therein for threading a cable fastener therethrough. For example, an aperture can be formed in a bottom surface of the arm and/or in a side surface of the arm. Additionally, the arm can include a number of side walls forming a channel. An arm can also include cable fasteners attached thereto for holding a number of cables with or without apertures formed in the arm.

In another aspect of the present invention, embodiments can include a rack apparatus having a number of slidable component mounts and a number of arms. The number of slidable component mounts includes a fixed portion and a slidable portion. The number of arms can each have an open and a closed position and two arm portions with each arm portion having two ends and a bend formed at one end. In such embodiments, the ends of each arm portion having the bend can be hinged together and one of the other ends can be attached to the fixed portion of one of the mounts.

Various embodiments of this aspect of the present invention can include arm portions that have a back surface. In some embodiments, two arm portions can have back surfaces that abut each other when the arm is in a closed position. In various embodiments, the arms can also be detachable from the mounts. For example, a removable pin can be used to hold the arm to the mount and can be removed to detach the arm from the mount. In such embodiments, the removable nature of the arms allows the arms to be repaired or replaced without substantial time or effort.

Additionally, the arms discussed with respect to the various embodiments of the present invention can be sized to accommodate various cable sizes and types. For example, in various embodiments, an arm can be sized to accommodate a number of cables and in some embodiments, an arm can be sized to accommodate a ribbon cable, however, the embodiments of the invention are not so limited.

DETAILED DESCRIPTION OF THE PREFERRED EMBODIMENTS

Embodiments of the present invention include systems and apparatuses for cable organization. Embodiments of the present invention will now be described in relation to the accompanying drawings, which will at least assist in illustrating the various features of the various embodiments.

Figure 1A:
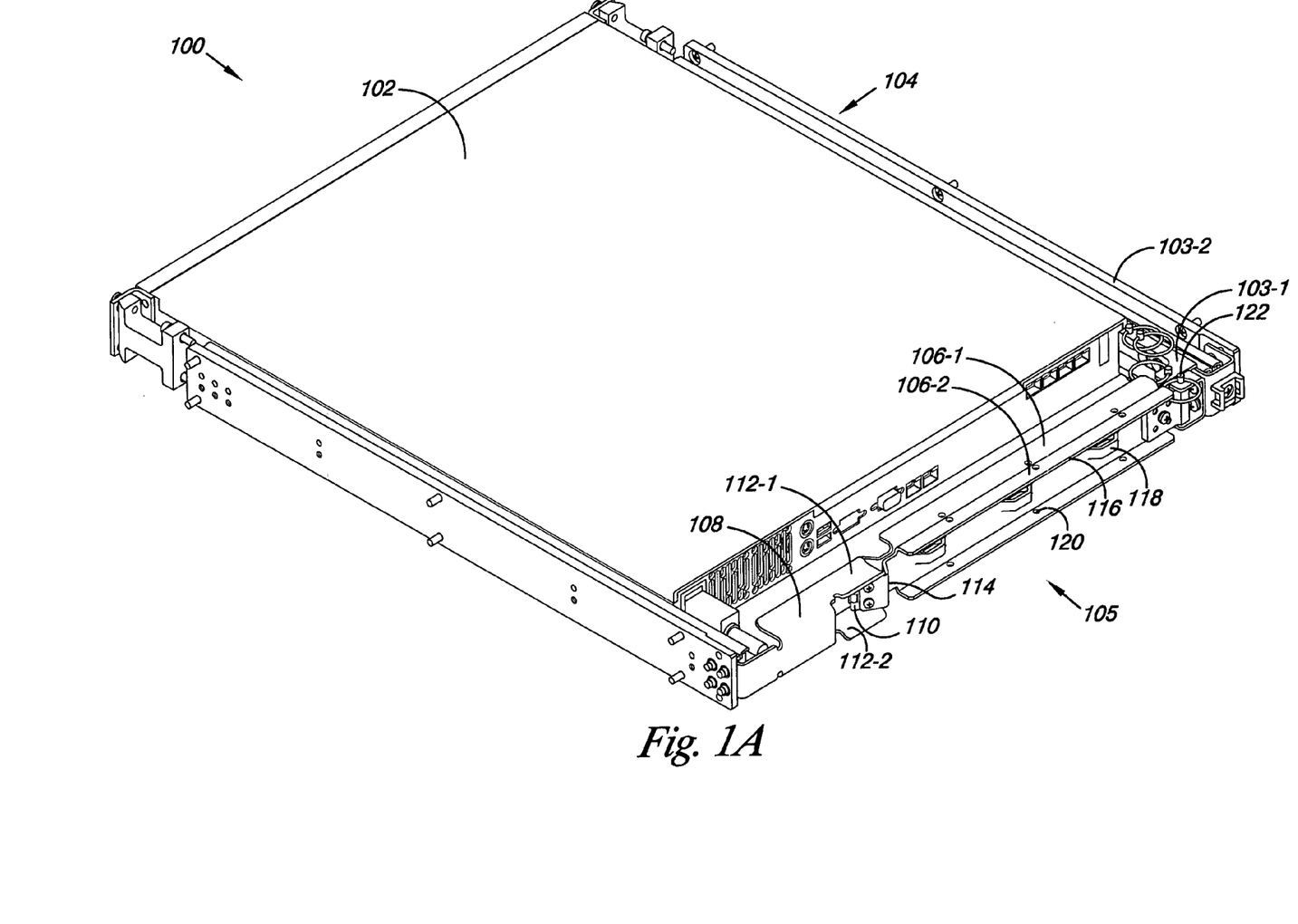
FIG. 1A is an illustration of an apparatus embodiment having an electrical component slidable thereon in its closed position.
Figure 1B:
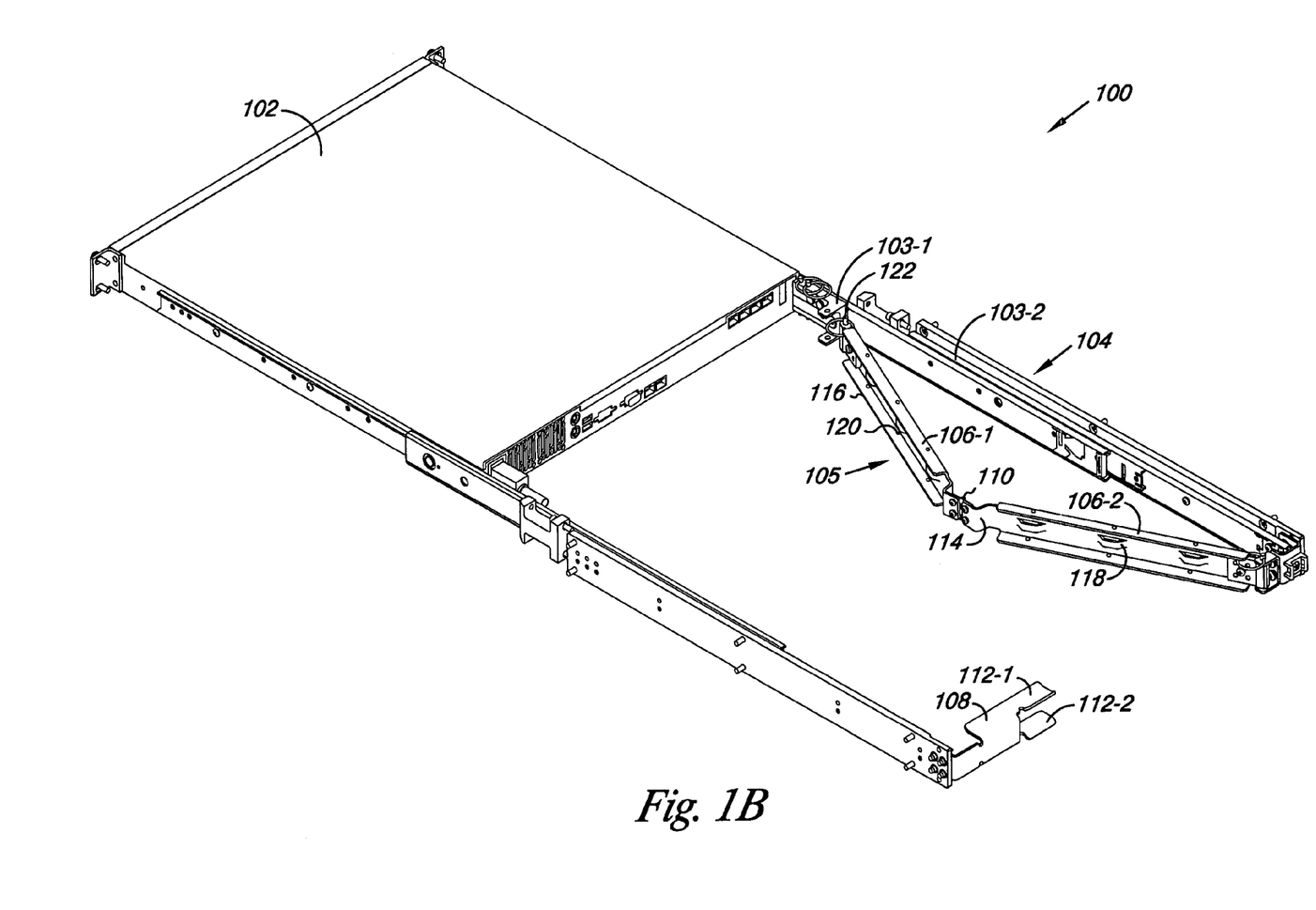
FIG. 1B is an illustration of the apparatus embodiment of FIG. 1A in its open position.

FIGS. 1A and 1B are illustrations of an apparatus embodiment. FIG. 1A illustrates the apparatus embodiment in a closed position. This position is typically used when the electronic component is in normal operation. FIG. 1B illustrates the apparatus embodiment of FIG. 1A in an open position. This position is typically used when the back of the electrical component is being accessed, such as when new components are being connected thereto, the component is being disconnected from other devices or component, maintenance is being performed, and other such situations. The embodiment of FIG. 1A includes an electrical apparatus 100 having an electrical component 102. The electrical component 102 is slidably attached to the rack structure 104 having a slidable portion 103-1 and a fixed portion 103-2. The arm 105 in this embodiment includes first and second arm portions 106-1 and 106-2 and upstanding sidewalls 116 forming a channel. The channel has an aperture formed in the bottom surface 118 and apertures 220 formed in the sidewalls 116.

The embodiment also includes a knuckle 114 formed from bends in at least one of the arm portions 106-1 and 106-2. In the illustrated example, both arm portions 106-1 and 106-2 include a bend therein. As stated above, the knuckle can have various sizes, for example, the size of the knuckle can be based upon the cable to be used with the arm and the space available for the knuckle, among other factors.

The arm portions 106-1 and 106-2 are joined by a hinge 110. Although a mechanical hinge is illustrated in FIGS. 1A–3B, those of ordinary skill in the art will appreciate from reading the present disclosure that other flexible joining mechanisms can be used in place of a mechanical hinge to provide the folding functionality of the embodiments of the present invention. Examples of other mechanisms include flexible materials, such as elastomers, and the like.

The embodiment of FIG. 1A also includes a movement support member 108. In the embodiment shown in FIG. 1A, the movement support member 108 includes an upper and a lower vertical movement support member 112-1 and 112-2, respectively. These members 112-1 and 112-2 can be positioned to frictionally engage the arm 105 as the apparatus 100 is moved from the open to the closed position. Additionally, as shown in the embodiment of FIG. 1A the members can have a flange bent outward to aid in receiving and/or positioning the arm 105.

Movement support members can also include horizontal movement supports. An example of a horizontal movement support is shown and described below with respect to FIGS. 3A and 3B. Although movement support members are shown extending to restrict the knuckle 114 portion of the arm 105, the movement support member 108 can be longer or shorter to contact the arm 105 in a different position and can be designed to engage the arm 105 to a greater or lesser extent than shown in the accompanying figures.

The embodiment shown in FIG. 1A also includes a removable pin 122 for securing the arm 105 to the rack 104. In FIG. 1A, one portion 106-2 of the arm 105 is attached by the removable pin 122 to the fixed portion 103-2 of the rack 104. The end of the other portion 106-1 of the arm 105 is attached to the slidable portion 103-1 of the rack 104. In this way, as shown in FIG. 1B, the arm 105 can be unfolded to extend as the electrical component 102 is slid out of the rack 104.

FIG. 1B is an illustration of the apparatus embodiment of FIG. 1A in its open position. In this illustration, the electrical component 102 has been slid out of the rack 104 from the closed position shown in FIG. 1A to the open position shown in FIG. 1B. The sliding has resulted in the movement of rack portion 103-1 relative to rack portion 103-2 and the unfolding of arm 105. When the arm 105 is unfolded, the arm portions 106-1 and 106-2 are extended to allow cable mounted to the arm 105 to be supported by the arm as the electrical component 102 is slid out of the rack 104 as shown in FIG. 1D and described in more detail below. As illustrated in FIG. 1B, the knuckle 114 of the arm 105 is unfolded as well, due to the flexible joinder of the arm portions 106-1 and 106-2 at hinge 110.

Figure 1C:
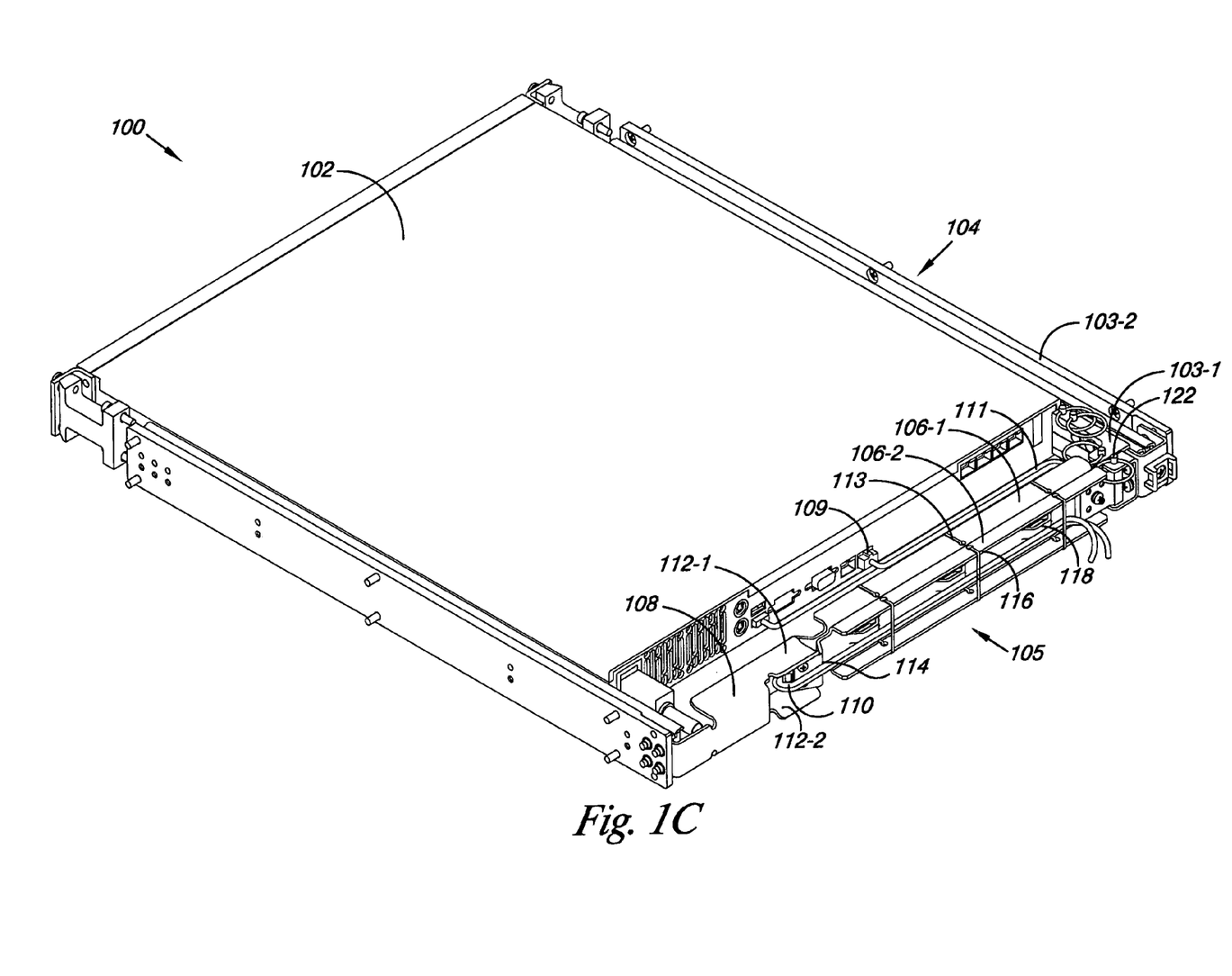
FIG. 1C is an illustration of the apparatus embodiment of FIG. 1A having a number of cables positioned on the arm.
Figure 1D:
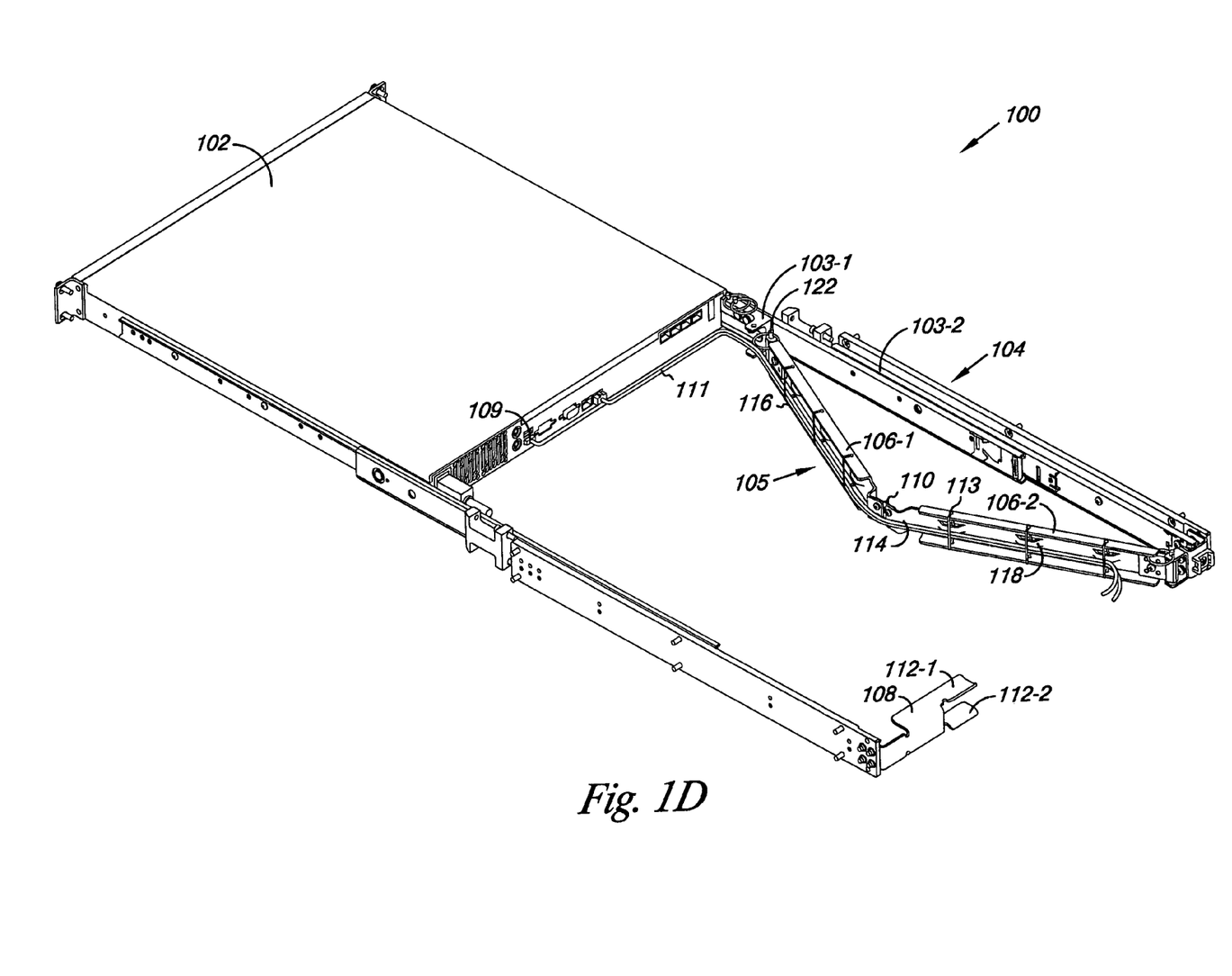
FIG. 1D is an illustration of the apparatus embodiment of FIG. 1B having a number of cables positioned on the arm.

FIG. 1C is an illustration of the apparatus embodiment of FIG. 1A having a number of cables positioned on the arm. In this illustration, a number of cables 111 are connected to the electrical component 109. The cables 111 are routed around the arm 105. For instance, in the example illustrated in FIG. 1C, the cables 111 are routed along the back of the electrical component 102 and onto the arm portion 106-1 at a position proximate to the end of the arm portion 106-1 that is attached to the rack 104. If a channel is present, the cables 111 are routed along the back of the electrical component 102 and enter the channel of the arm portion 106-1 formed by sidewalls 116. If no channel is present, the cables 111 are aligned along the surface of arm portion 106-1.

In the embodiment shown in FIG. 1C, a number of cable fasteners 113 (e.g., zip ties, string, wire, etc) have been threaded through the apertures 120. In embodiments using cable fasteners, the cable fasteners 113 can also, or alternatively, be threaded through one of the apertures 118 formed in the bottom surface of arm portion 106-1.

In the embodiment shown in FIG. 1C, the cables 111 continue down the arm portion 106-1 until the cables 111 reach the knuckle 114. The cables 111 extend around the knuckle 114 and are aligned along arm portion 106-2. The cables 111 continue down arm portion 106-2 and then off the arm portion 106-2 at a position proximate to the end of the arm portion 106-2 that is attached to the rack 104.

In various embodiments, the channel formed from the upstanding sidewalls 116 and the cable fasteners 113, illustrated in FIG. 1C, can aid in keeping the cables aligned with the arm 105 and can be beneficial either individually or in combination in reducing tangling of the various cables 111 along the arm 105 and with other cables that may not be along arm 105. Additionally, the upstanding sidewalls 116 can provide other benefits, such as protecting the cables from damage due to contact with other components, arms, and the like, and can add rigidity to the arm. In the latter respect, sidewalls can also be angled downward instead of being upstanding to provide rigidity to the arm.

FIG. 1D is an illustration of the apparatus embodiment of FIG. 1B having a number of cables positioned on the arm. In this illustration, the path of the cables 111 from their connection 109 to the electrical component 102 can be more easily identified. As can be seen from this illustration, if the cables 111 are routed along the arm portions 106-1 and 106-2 and over the knuckle 114, when the arm portions 106-1 and 106-2 are extended, the cables 111 are straightened and thereby the electrical component 102 can be slid out of the rack 104 without disconnecting the cables 111.

Figure 2A:
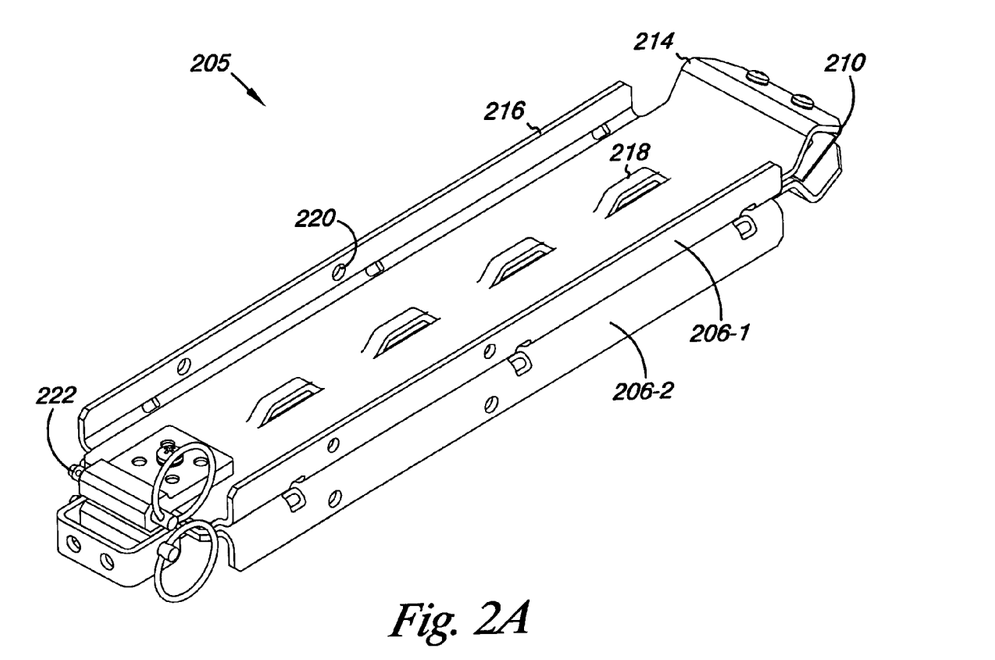
FIG. 2A is an illustration of an embodiment of an arm.
Figure 2B:
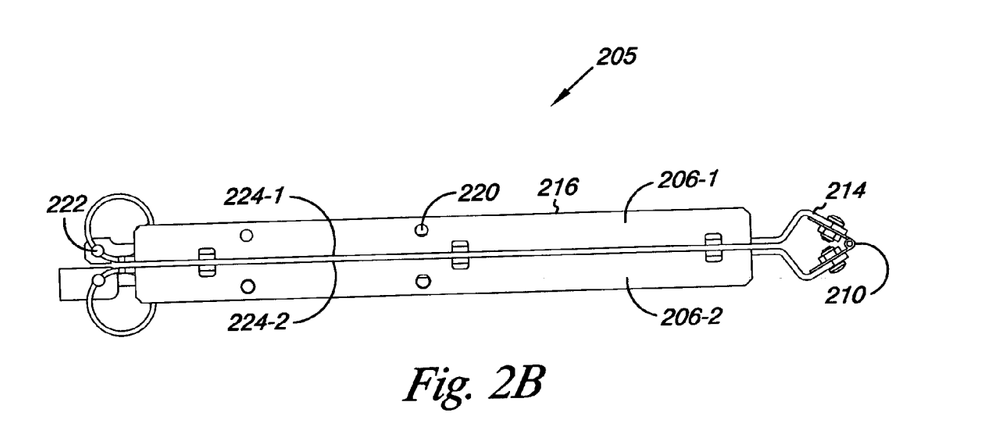
FIG. 2B a side view of the embodiment of FIG. 2A.

FIG. 2A is an illustration of an embodiment of an arm and FIG. 2B a side view of the embodiment of FIG. 2A. In these figures, some of the features that can be used in various embodiments of an arm 205 are shown in greater detail. For example, the apertures 220 are shown and several additional apertures are provided along the junction of the upstanding sidewalls 216 and the bottom surface of the arm portions 206-1 and 206-2.

Another detail that is more prominently shown in FIGS. 2A and 2B is the rounding and chamfering of the edges including the corners of the arm portions 206-1 and 206-2. For example, the ends of the upper edge of the sidewalls 216 are chamfered and the bends forming knuckle 214 are rounded to reduce the possibility of damaging the cables if contact between the arm 205 and the cables were made. Although the bends forming the knuckle 214 are not at the edge of the lateral periphery of the arm 205, for purposes of the present disclosure, protrusions of the surface of the arm 205, such as the bends forming the knuckle 214 and forming the upstanding sidewalls 216, can be considered edges of the arm 205.

FIGS. 2A and 2B also show greater detail regarding possible mechanisms for attaching the arm 205 to the rack and for joining the arm portions 206-1 and 206-2 together. In the examples shown, the attachment of the arm 205 to the rack can be provided by a removable pin 222, as briefly discussed above. In this embodiment, the removable pin 222 includes a ring at one end to aid in removal of the pin 222 and a detent on the other end of the pin 222 to aid in keeping the pin 222 in place. In the embodiment shown in FIGS. 2A and 2B, the joinder of arm portions 206-1 and 206-2 is accomplished by fastening a hinge 210 to each of the arm portions 206-1 and 206-1. In the embodiment shown, this attachment is made by a number of nuts and bolts. Those of ordinary skill in the art will appreciate from reading the present disclosure, however, that any fixed or removable mechanism can be used for attachment of the arm 205 to the rack or for joinder of the arm portions 206-1 and 206-2.

FIG. 2B also illustrates space saving features incorporated into the design of the arm embodiment shown in FIG. 2B. For example, the embodiment uses a knuckle 214 and parallel back sides 224-1 and 224-2 of the arms 206-1 and 206-2.

The use of these features together allows for the amount of space used by the arms 206-1 and 206-2 to be reduced along most of the length of the arms 206-1 and 206-2, while still providing a turning radius that is desirable to reduce the damage due to the bending of cables utilizing the arms 206-1 and 206-2.

Figure 3A:
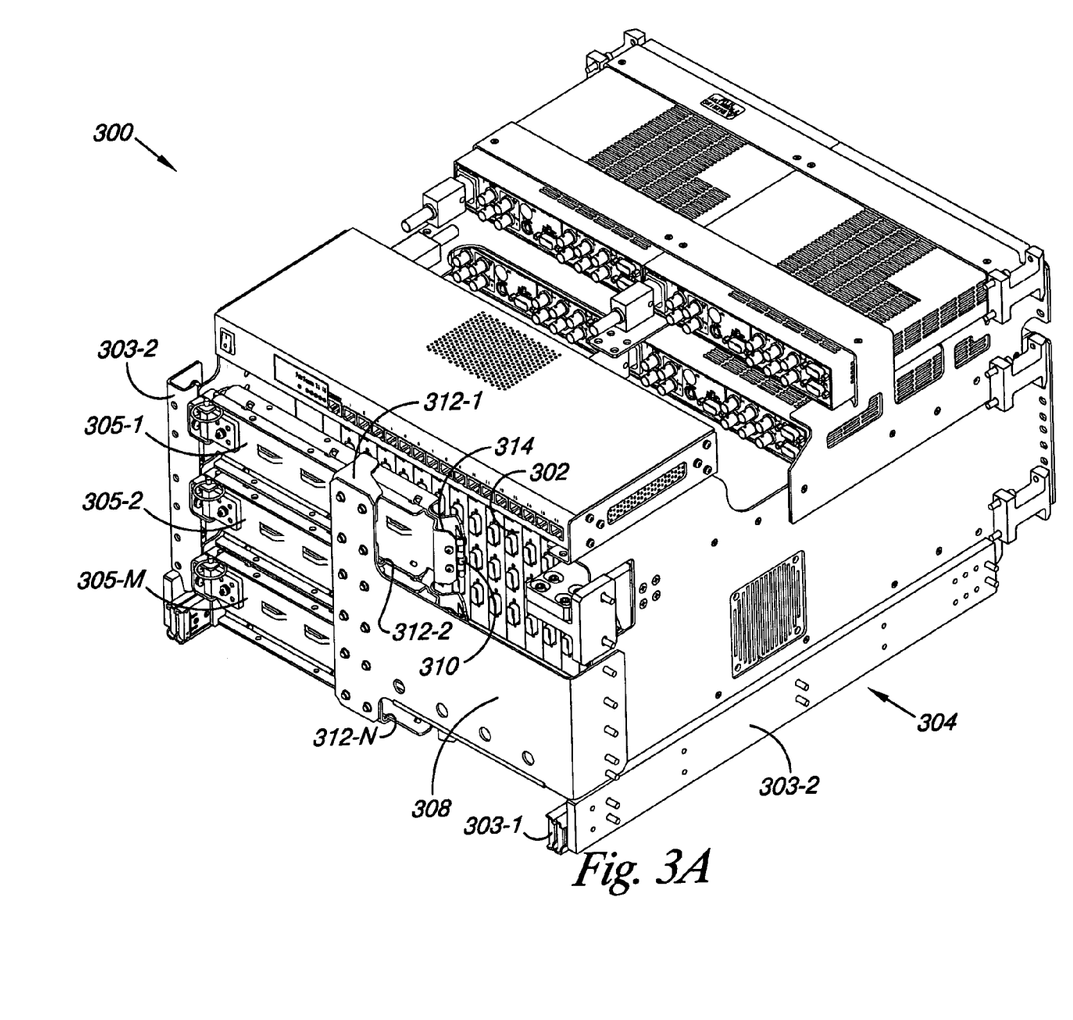
FIG. 3A is an illustration of an apparatus embodiment having several arms and an electrical component slidable thereon in its closed position.
Figure 3B:
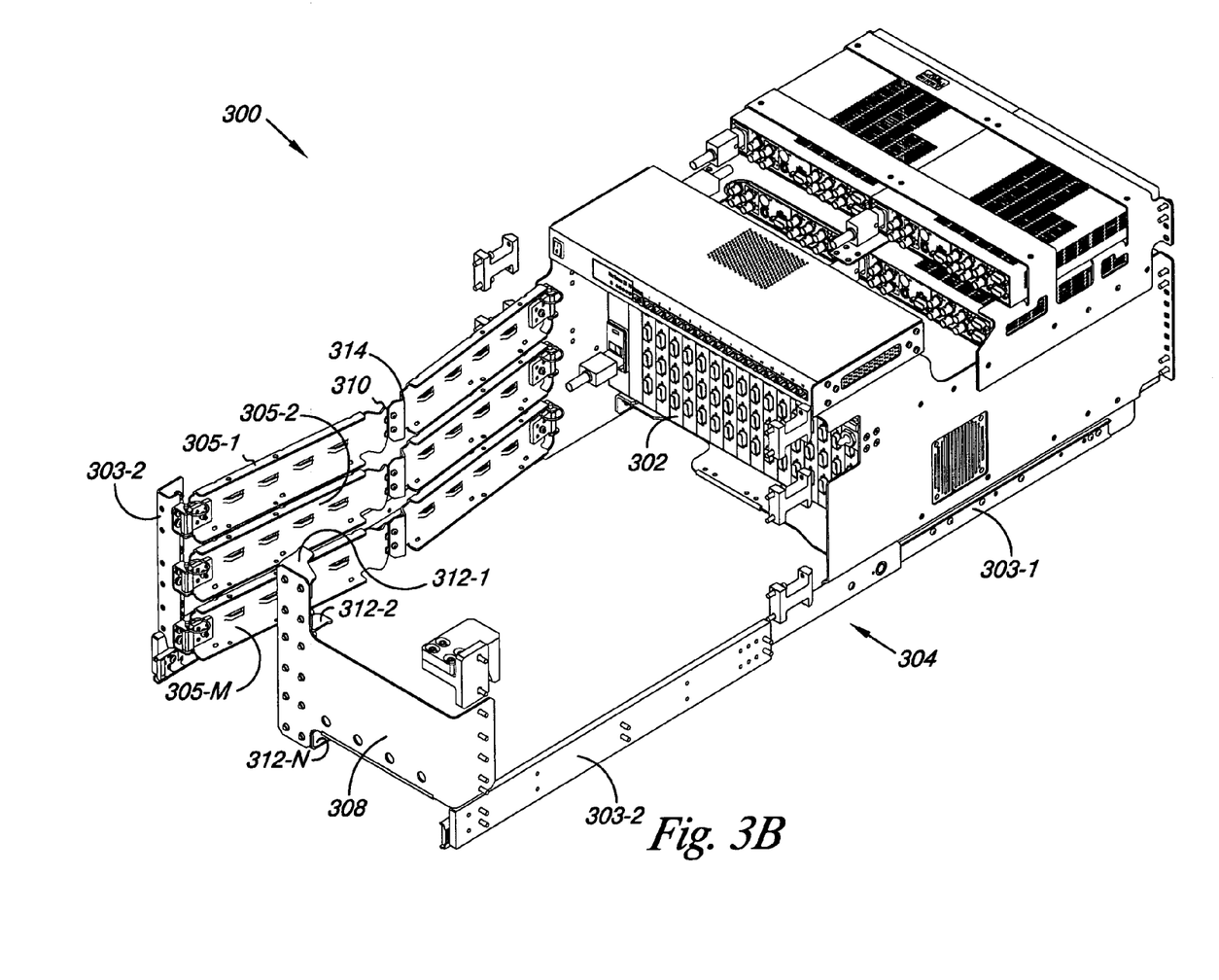
FIG. 3B is an illustration of the apparatus embodiment of FIG. 3A in its open position.

FIG. 3A is an illustration of an apparatus embodiment, having several arms and an electrical component slidable thereon in its closed position. FIG. 3B is an illustration of the apparatus embodiment of FIG. 3A in its open position. In this embodiment, the apparatus includes a number of arms 305-1, 305-2, and 305-M, where M can be any number and is used to represent that various embodiments can have any number of arms. The arms 305-1, 305-2, and 305-M are attached at one end to the fixed portion 303-2 of the rack 304 and at the other end, to the slidable portion 303-1 of the rack 304 which moves with electrical component 302 when the electrical component 302 is slid out of the rack 304.

The embodiment shown in FIGS. 3A and 3B also includes a movement support member 308 having a number of vertical support members 312-1, 312-2, and 312-N where N can be any number and is used to represent that various embodiments can have any number of vertical support members.

Additionally, the surface of movement support member 308 extends such that the a portion of the surface will restrict the horizontal movement of the arms 305-1, 305-2, and 305-M in one direction, thereby acting as a horizontal support. In some embodiments, horizontal movement in the other direction can be restricted by the back of the electrical component 302 and/or by cables positioned between the arms 305-1, 305-2, and 305-M and the electrical component 302. In various embodiments, horizontal support members can be provided and attached or unitarily formed on movement support member 308.

The use of the symbols M and N herein is used to represent the numbers of particular components, but should not be construed to limit the number of any other items described herein. Additionally, the terms horizontal and vertical have been used to illustrate relative orientation with respect to each other and should not be viewed to limit the elements of the invention to such directions as they are described herein.

Although specific embodiments have been illustrated and described herein, those of ordinary skill in the art will appreciate that any arrangement calculated to achieve the same techniques can be substituted for the specific embodiments shown. This disclosure is intended to cover adaptations or variations of various embodiments of the invention. It is to be understood that the above description has been made in an illustrative fashion, and not a restrictive one.

Combination of the above embodiments, and other embodiments not specifically described herein will be apparent to those of ordinary skill in the art upon reviewing the above description. The scope of the various embodiments of the invention includes various other applications in which the above structures and methods are used. Therefore, the scope of various embodiments of the invention should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the embodiments of the invention require more features than are expressly recited in each claim. Rather, as the following claims reflect, inventive subject matter may lie in less than all features of a single disclosed embodiment. Thus, the following claims are hereby incorporated into the Detailed Description, with each claim standing on its own as a separate embodiment.

The invention claimed is:

1. A cable management apparatus, comprising:
   an arm having an open and a closed position and two arm portions;
   each arm portion having two ends, a cable surface, a back surface, and a bend formed at one end;
   wherein the ends of each arm portion having the bend are hinged together to form a knuckle when the arm is in the closed position and wherein the back surfaces are substantially parallel to each other; and
   wherein the knuckle has a diameter that is greater than the distance between the cable surfaces of the arm portions.

2. The apparatus of claim 1, wherein the knuckle is sized to maintain a particular bend radius of a cable.

3. The apparatus of claim 2, wherein the knuckle is sized to maintain a bend radius of a cable above that of a damaging bend radius.

4. The apparatus of claim 1, wherein the hinged arm portions are foldable to half their combined length.

5. The apparatus of claim 1, wherein each arm portion has a back surface and wherein when the arm is in the closed position, the back surfaces are substantially parallel with each other.

6. An electronics system, comprising:
   an electronic component;
   a rack in which the electronic component is slidably mounted; and
   a cable management apparatus comprising:
   a number of arms each arm having an open and a closed position and two arm portions;
   each arm portion having two ends, a cable surface a back surface, and a bend formed at one end;
   wherein the ends of each arm portion having the bend are hinged together to form a knuckle when the arm is in the closed position and wherein the back surfaces are substantially parallel to each other; and
   wherein the knuckle has a diameter that is greater than the distance between the cable surfaces of the arm portions.

7. The system of claim 6, wherein the system includes three arms arranged in parallel to each other.

8. The system of claim 6, wherein the system includes three arms with two arms arranged parallel to each other on one side of the rack and the third arm arranged on the other side of the rack.

9. The system of claim 6, wherein each arm includes a number of edges and wherein at least one of the edges is rounded.

10. The system of claim 6, wherein each arm includes a number of edges and wherein at least one of the edges is chamfered.

11. The system of claim 6, wherein the electronic component is a network server.

12. An electronics system, comprising:
    an electronic component;
    a rack in which the electronic component is slidably mounted; and
    a cable management apparatus comprising:
    a number of arms each having an open and a closed position and two arm portions;
    each arm portion having two ends, a cable side, and a back side;
    wherein one end of each arm portion is hinged together; and
    wherein the back sides are substantially parallel to each other when the arm is in the closed position and
    wherein the hinged together ends have a diameter that is greater than the distance between the cable sides of the arm portions.

13. The system of claim 12, wherein the system includes a number of vertical movement supports.

14. The system of claim 13, wherein each of the number of vertical movement supports includes a vertical support member positioned above and below each arm when each arm is in the closed position.

15. The system of claim 12, wherein the system includes a number of horizontal movement support members positioned to restrict horizontal movement of one of the arms when the arm is in the closed position.

16. The system of claim 12, wherein the system includes a number of vertical supports positioned to restrict vertical movement of one of the arms when the arm is in the closed position and a number of horizontal movement supports positioned to restrict horizontal movement of one of the arms when the arm is in the closed position.

17. The system of claim 16, wherein the each arm is frictionally engaged by at least one of the number of horizontal and vertical movement supports.

18. A rack apparatus, comprising:
    a rack housing;
    a number of slidable component mounts, each slidable component mount having a fixed portion and a slidable portion;
    a number of arms each having an open and a closed position and two arm portions;
    each arm portion having two ends, a cable side, a back side, and a bend formed at one end;
    wherein the ends of each arm portion having the bend are hinged together and wherein one of the other ends is attached to the fixed portion of one of the mounts; and
    a movement support member attached to the rack housing and positioned to frictionally engage one of the arms to control the movement of the arm when the arm is in a closed position.

19. The apparatus of claim 18, wherein at least one of the arms includes a number of apertures formed therein for threading a cable fastener therethrough.

20. The apparatus of claim 19, wherein at least one of the apertures is formed in a bottom surface of the arm.

21. The apparatus of claim 19, wherein at least one of the apertures is formed in a side surface of the arm.

22. The apparatus of claim 18, wherein at least one arm portion includes a number of side walls forming a channel.

23. The apparatus of claim 18, wherein at least one of the arms includes cable fasteners attached thereto for holding a number of cables.

24. A rack apparatus, comprising:
    a number of slidable component mounts, each said slidable component mount having a fixed portion and a slidable portion;
    a number of arms each having an open and a closed position and two arm portions;
    each arm portion having two ends, a cable surface, a back surface, and a bend formed at one end; and
    wherein the ends of each arm portion having the bend are hinged together and wherein one of the other ends is attached to the fixed portion of one of the mounts;

wherein when the arm is in the closed position the back surfaces are substantially parallel to each other, and wherein the hinged together ends form a knuckle that has a diameter that is greater than the distance between the cable surfaces of the arm portions.

25. The apparatus of claim 24, wherein the back surfaces abut each other when the arm is in a closed position.

26. The apparatus of claim 24, wherein each of the arms is detachable from the mounts.

27. The apparatus of claim 26, wherein the arms are detachable by the removal of a removable pin holding the arm to the mount.

28. The apparatus of claim 24, wherein at least one of the arms is sized to accommodate a number of cables.

29. The apparatus of claim 24, wherein at least one of the arms is sized to accommodate a ribbon cable.

* * * * *